(12) United States Patent
Zeng et al.

(10) Patent No.: US 12,150,354 B2
(45) Date of Patent: *Nov. 19, 2024

(54) DISPLAY DEVICE INCLUDING SUPPORT STRUCTURE TO REDUCE BREAKAGE OF SIGNAL LINES

(71) Applicants: Chengdu BOE Optoelectronics Technology Co., Ltd., Sichuan (CN); BOE Technology Group Co., Ltd., Beijing (CN)

(72) Inventors: Chao Zeng, Beijing (CN); Weiyun Huang, Beijing (CN); Yue Long, Beijing (CN); Yao Huang, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/242,231

(22) Filed: Sep. 5, 2023

(65) Prior Publication Data

US 2023/0413623 A1    Dec. 21, 2023

Related U.S. Application Data

(63) Continuation of application No. 16/960,190, filed as application No. PCT/CN2019/098533 on Jul. 31, 2019, now Pat. No. 11,785,812.

(51) Int. Cl.
| | | |
|---|---|---|
| *H10K 59/131* | (2023.01) | |
| *H10K 50/80* | (2023.01) | |
| *H10K 50/87* | (2023.01) | |
| *H10K 59/122* | (2023.01) | |
| *H10K 59/40* | (2023.01) | |
| *H10K 77/10* | (2023.01) | |
| *H10K 102/00* | (2023.01) | |

(52) U.S. Cl.
CPC ........ *H10K 59/131* (2023.02); *H10K 50/868* (2023.02); *H10K 50/87* (2023.02); *H10K 59/122* (2023.02); *H10K 59/40* (2023.02); *H10K 77/111* (2023.02); *H10K 2102/311* (2023.02)

(58) Field of Classification Search
CPC .............. H01L 27/3276; H01L 27/323; H01L 27/3246; H01L 51/0097; H01L 51/529; H01L 51/5293; H01L 2251/5338; H10K 59/131; H10K 59/40; H10K 59/122; H10K 77/111; H10K 50/87; H10K 50/868; H10K 2102/311
USPC ............................................. 257/40, 59, 49
See application file for complete search history.

(56) References Cited

U.S. PATENT DOCUMENTS 11,785,812 B2 * 10/2023 Zeng ...................... H10K 59/40
257/40

* cited by examiner

*Primary Examiner* — Lex H Malsawma
*Assistant Examiner* — Eric W Jones
(74) *Attorney, Agent, or Firm* — Lippes Mathias LLP (57) ABSTRACT

Provided are a display panel including: a first component, a second component, and a bending component connecting the first component and the second component; wherein, the first component has a display surface, and the bending component has a via passing through the bending component in a direction perpendicular to the display surface. A display device is also provided.

20 Claims, 6 Drawing Sheets

DISPLAY DEVICE INCLUDING SUPPORT STRUCTURE TO REDUCE BREAKAGE OF SIGNAL LINES

CROSS-REFERENCE TO RELATED APPLICATION

This application is a continuation application of U.S. application Ser. No. 16/960,190, filed on Jul. 6, 2020, which is a 371 of PCT/CN2019/098533 filed on Jul. 31, 2019, the disclosures of which are incorporated herein by reference in their entireties.

TECHNICAL FIELD

The present disclosure relates to the field of display technologies, and in particular, to a display panel and a display device.

BACKGROUND

Flexible display panels are gaining more and more attention because of their advantages of light weight, thinness, bendability, foldability, and good mechanical properties. The flexible display panel is usually fabricated on a flexible carrier. In an existing flexible display panel, in order to increase the screen ratio of the display area and reduce the width of the edge below the display area, the area where the control chip is bound onto the flexible display panel is bent to the back of the display area to achieve a narrow bezel design.

SUMMARY

The present disclosure provides a display panel and a display device, and the technical solutions are as follows:

In an aspect, a display panel is provided, including:
  a first component, a second component, and a bending component connecting the first component and the second component;
  wherein the first component has a display surface, and the bending component has a via passing through the bending component in a direction substantially perpendicular to the display surface.

In some embodiments, the bending component includes a first bending subcomponent connected to the first component and a second bending subcomponent connected to the second component; and
  the via includes a first hole in the first bending subcomponent and a second hole in the second bending subcomponent, and an orthographic projection of the first hole onto a plane of the display surface and an orthographic projection of the second hole onto the plane of the display surface at least partially coincide.

In some embodiments, the orthographic projection of the first hole onto the plane of the display surface completely coincides with the orthographic projection of the second hole onto the plane of the display surface.

In some embodiments, the first hole communicates with the second hole.

In some embodiments, a number of the via is 1, and the via passes through the bending component in a thickness direction of the bending component.

In some embodiments, the bending component has a plurality of vias arranged in an array in a direction parallel to a bending axis, and each of the vias passes through the bending component in a thickness direction of the bending component.

In some embodiments, the via extends into the first component and the second component.

In some embodiments, the first component has a fan-out area, an edge area, and a display area sequentially arranged in a direction away from the bending component, and the via extends to the fan-out area.

In some embodiments, the bending component has opposing first and second sides, the first side joins the first component, and the second side joins the second component;
  a maximum distance from an edge of the via located in the first component to the first side ranges from 145 to 155 microns; and
  a maximum distance from an edge of the via located in the second component to the second side ranges from 1.2 to 1.6 mm.

In some embodiments, the via is located at the center of the bending component in a first direction parallel to a bending axis of the bending component.

In some embodiments, when the bending component is in a flatly deployed state, a size of the via in the first direction ranges from 7 to 9 mm, and a size of the via in a second direction ranges from 3 to 4 mm, the second direction being perpendicular to the first direction.

In some embodiments, the bending component has a bending portion symmetrically arranged on both sides of the via in the first direction, and the bending portion is provided with signal lines extending to the second component and connected to signal leads in the fan-out area of the first component.

In some embodiments, the signal lines in the bending portion includes a first power signal line, a first data signal line, a second power signal line and a second data signal line that are arranged insulatedly and sequentially in a direction away from the via.

In some embodiments, a minimum distance between the via and the first power signal line ranges from 0.8 to 1.2 mm.

In some embodiments, the display panel further includes a control chip, wherein the signal lines in the second component are connected to the control chip through a chip-on-film film.

In some embodiments, the display area of the first component includes a flexible base substrate, and an active layer, a first insulation layer, a first gate layer, a second insulation layer, a second gate layer, an interlayer dielectric layer, a first source-drain layer, a passivation layer, a first planarizing layer, a second source-drain layer, a second planarizing layer, a metal conductive layer, a pixel-defining layer, a light-emitting device and a packaging layer sequentially arranged in a direction away from the flexible base substrate.

In some embodiments, a region of the first component on a side of the via distal from the second component includes the flexible base substrate, and the interlayer dielectric layer, the first source-drain layer, the passivation layer, and the packaging layer sequentially arranged in a direction away from the flexible base substrate;
  a region, where the first power signal line is located, in the bending portion of the bending component includes the flexible base substrate, and a flexible material layer, the first source-drain layer, the first planarizing layer, the second source-drain layer, the second planarizing layer, and the pixel-defining layer sequentially arranged in a direction away from the flexible base substrate;

a region of the second component on a side of the via distal distal from the first component includes the flexible base substrate, and the interlayer dielectric layer, the passivation layer, the first planarizing layer, the second planarizing layer, and the pixel-defining layer sequentially arranged in a direction away from the flexible base substrate.

In some embodiments, a number of the via is 1, and the via passes through the bending component in a thickness direction of the bending component;

the via extends into the first component, and the via extends into the second component;

the via is located at the center of the bending component in a first direction parallel to the bending axis of the bending component.

In another aspect, a display device is provided, including the display panel of any one of the above aspect.

In some embodiments, the display device further includes: a support structure, a cover plate located on a side of the first component distal from the second component, and a bottom plate located on a side of the second component distal from the first component;

wherein a first end of the support structure is connected to the cover plate, a second end of the support structure is connected to the bottom plate, and an orthographic projection of the support structure onto the cover plate and an orthographic projection of the via onto the cover plate has an overlapping area.

In some embodiments, the orthographic projection of the support structure onto the cover plate is within the orthographic projection of the via onto the cover plate.

In some embodiments, a preparation material of the support structure includes one of plastic and metal materials.

In some embodiments, the preparation material of the cover plate includes one of an organic resin material and an inorganic flexible material.

In some embodiments, the display device further includes a touch layer and a polarizer located on a side of the first component distal from the second component and stacked in a direction away from the first component.

In some embodiments, the display device further includes a heat dissipation film on a side of the first component proximal to the second component.

In some embodiments, the display device further includes g a support assembly between the heat dissipation film and the second component, a first end of the support assembly is connected to the heat dissipation film, and a second end of the support assembly is connected to the second component.

In yet another aspect, a display device is provided, including:

a display panel including a first component, a second component, and a bending component connecting the first component and the second component;

a cover plate located on a side of the first component distal from the second component;

a bottom plate located on a side of the second component distal from the first component; and a support structure located on a side of the bending component distal from the first component and the second component, wherein a first end of the support structure is connected to the cover plate, and a second end of the support structure is connected to the bottom plate.

In some embodiments, a surface of the first component distal from the second component is a display surface, the support structure includes a plurality of columnar structures arranged in an array in a first direction parallel to a bending axis of the bending component.

In some embodiments, the surface of the first component distal from the second component is the display surface, the support structure is a row structure extending in a first direction parallel to the bending axis of the bending component.

In some embodiments, a length of the support structure in the first direction is equal to a length of the bending component in the first direction.

DETAILED DESCRIPTION

For clearer descriptions of the objects, technical solutions, and advantages of the present disclosure, the embodiments of the present disclosure are described in detail below in combination with the accompanying drawings.

Figure 1:
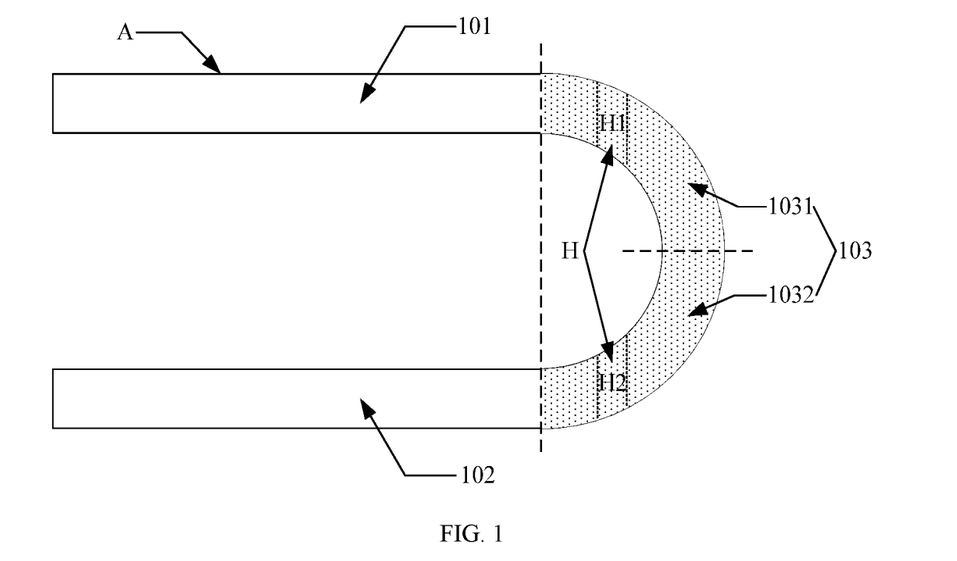
FIG. 1 is a schematic structural diagram of a display panel provided by some embodiments of the present disclosure.

FIG. 1 is a schematic structural diagram of a display panel provided by some embodiments of the present disclosure. As shown in FIG. 1, the display panel includes:

a first component 101, a second component 102, and a bending component 103 connecting the first component 101 and the second component 102.

Referring to FIG. 1, the first component 101 has a display surface A, and the bending component 103 has a via H passing through the bending component 103 in the direction substantially perpendicular to the display surface A. Here, a direction being substantially perpendicular to the display surface means that the angle between the direction and the perpendicular direction of the display surface is less than an angle threshold. For example, the direction substantially perpendicular to the display surface refers to a direction with an angle less than 5° from the perpendicular direction of the display surface.

In some embodiments, the first component is a display component (i.e., a display screen), and the second component is a bonding component. The side of the first component distal from the second component is the display surface of the display panel. When the first component is a foldable screen, the above display surface refers to the display surface of the foldable screen when it is completely deployed. The bonding component has an area for bonding a control chip, and this area may be referred to as a bonding area of the display panel.

In summary, in the display panel provided by the embodiment of the present disclosure, by disposing the via(s) passing through the bending component, when the bending component is in a bent state, the via(s) is/are beneficial for releasing the internal stress of the bending component, so as to achieve a balance in stress of the respective areas of the bending component, thereby ensuring the structural stability and reliability of the display panel.

In some embodiments, the via in the bending components is used to accommodate a support structure. At present, in order to achieve the bending function and/or the folding function of a display device, it is necessary to ensure that each layer structure in the display device has the ability to bend. Therefore, it is necessary to replace the glass cover plate used in the conventional display device with a flexible cover plate. However, the flexible cover plate will be easily deformed when subjected to external forces such as a press, and will in turn exert a force on the film layer underneath the flexible cover plate and influence the structural stability of the film layer. In particular, in the bending portion of the flexible display panel, the signal lines may break when subjected to an external force, which results in a risk. In some embodiments of the present disclosure, as the via in the bending component passes through the bending component in a direction substantially perpendicular to the display surface, by accommodating the support structure in the via, one end of the support structure accommodated in the via may be connected with the flexible cover plate when the display panel is encapsulated with the flexible cover plate. As such, when the flexible cover plate is subjected to external forces such as a press, the support structure can provide a great supporting effect to avoid the breakage of the signal lines in the bending component due to the external force thereon, thereby ensuring the mechanical performance of the display panel.

In some embodiments, referring to FIG. 1 again, the bending component 103 includes a first bending subcomponent 1031 connected to the first component 101 and a second bending subcomponent 1032 connected to the second component 102. The via H includes a first hole H1 in the first bending subcomponent 1031 and a second hole H2 in the second bending subcomponent 1032, that is, the via H is composed of the first hole H1 and the second hole H2. The orthographic projection of the first hole H1 onto the plane of the display surface A and the orthographic projection of the second hole H2 onto the plane of the display surface A at least partially coincide.

In the embodiment of the present disclosure, the bending component is divided into the first bending subcomponent and the second bending subcomponent. This is only for the purpose of explaining the positions of the vias conveniently, and the first bending subcomponent and the second bending subcomponent are actually still an integrated structure.

In some embodiments, the orthographic projection of the first hole onto the plane of the display surface completely coincides with the orthographic projection of the second hole onto the plane of the display surface. It should be noted that, when the orthographic projection of the first hole onto the plane of the display surface and the orthographic projection of the second hole onto the plane of the display surface completely coincide, the first hole and the second hole have the same aperture size, and a support structure that matches the aperture size of the first and second holes can be selected. When the support structure passes through the first hole and the second hole, the first hole and the second hole may effectively limit the position of the support structure in a direction parallel to the display surface.

Figure 2:
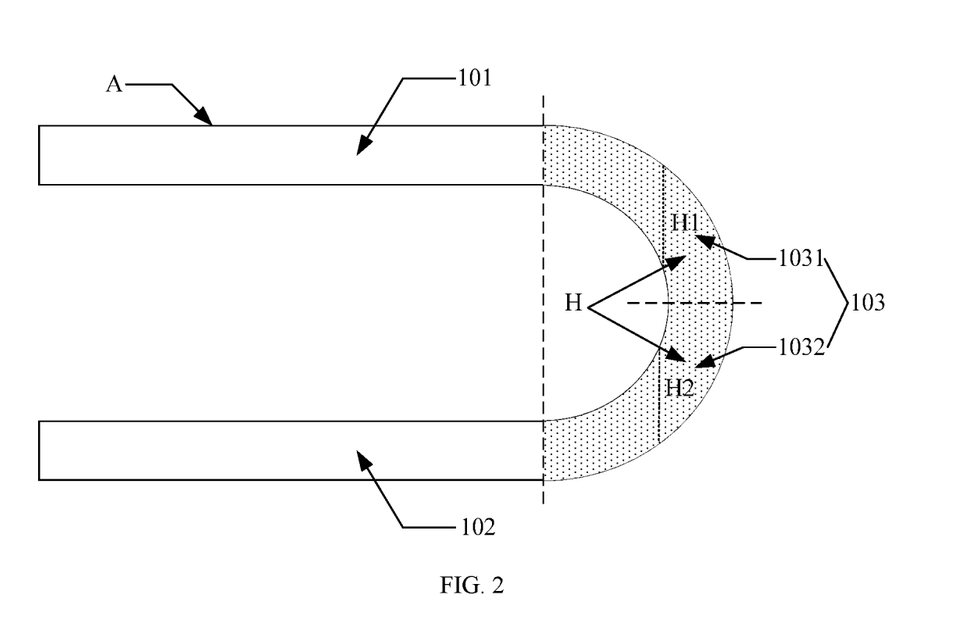
FIG. 2 is a schematic structural diagram of another display panel provided by some embodiments of the present disclosure.

In some embodiments, FIG. 2 is a schematic structural diagram of another display panel provided by some embodiments of the present disclosure. As shown in FIG. 2, the first hole H1 in the first bending subcomponent 1031 and the second hole H2 in the second bending subcomponent 1032 communicate with each other.

In some embodiments, in the display panel provided by the present disclosure, the number of the via(s) in the bending component is 1, and the via passes through the bending component in the thickness direction of the bending component. In some embodiments, the bending component has a plurality of vias arranged in an array in a direction parallel to the bending axis, and each via passes through the bending component in the thickness direction of the bending component.

Exemplarily, referring to FIG. 1 and FIG. 2, the structure of the display panel will be further described by taking the number of vias in the bending component being 1 as an example in the embodiment of the present disclosure.

Figure 3:
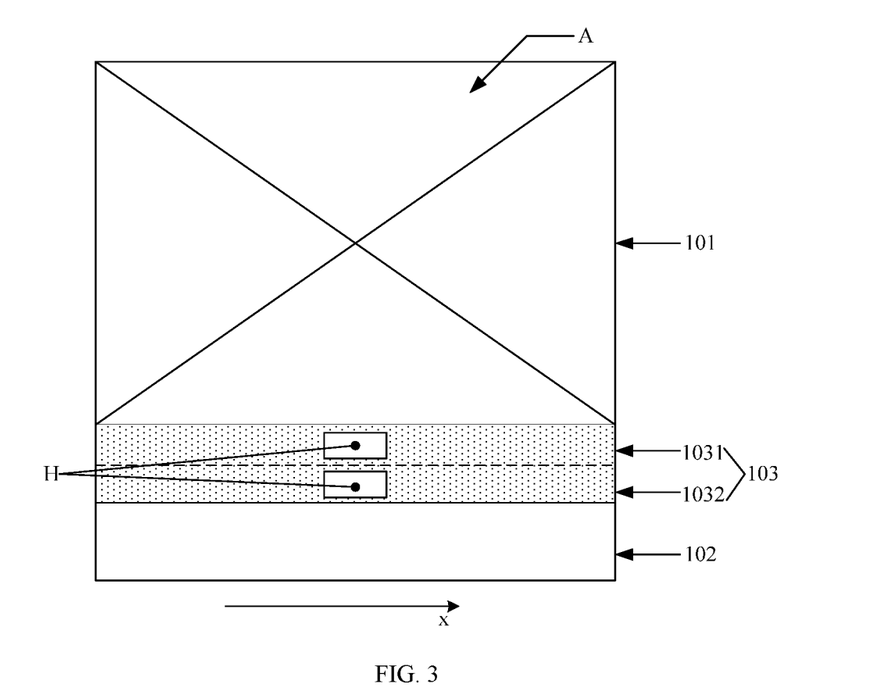
FIG. 3 is a schematic diagram of the display panel shown in FIG. 1 being deployed.
Figure 4:
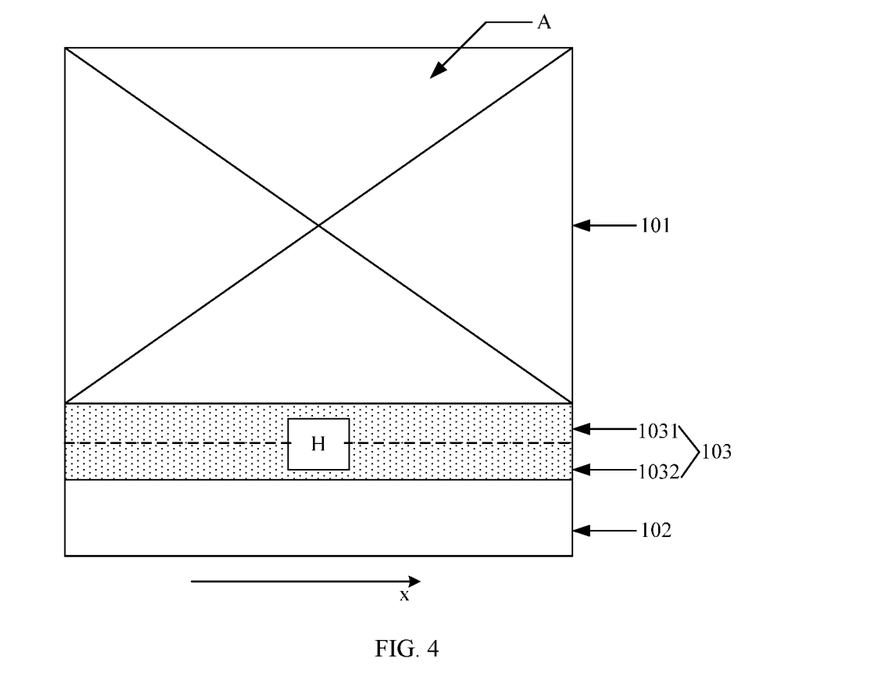
FIG. 4 is a schematic diagram of the display panel shown in FIG. 2 being deployed.

In some embodiments, FIG. 3 is a schematic diagram of the display panel shown in FIG. 1 being deployed, and FIG. 4 is a schematic diagram of the display panel shown in FIG. 2 being deployed. As shown in FIG. 3 and FIG. 4, the via H is located at the center of the bending component 103 in the first direction x which is parallel to the bending axis of the bending component 103. In the display panel shown in FIGS. 3 and 4, the via H is a rectangular via, as an example. The via may also be a circular via, an irregular-shaped via, or via with other shape. The embodiment of the present disclosure does not limit the shape of the via.

It should be noted that as the via is in the center of the bending component in the first direction, when a support structure is provided in the via, the support structure can have a uniform protection effect on the structure of the bending component on both sides of the via in the first direction, thereby ensuring the mechanical performance of the display panel.

In an optional embodiment of the present disclosure, when the bending component is in a flatly deployed state, a via is formed in the bending component, and then the bending component is bent to obtain a display panel. For example, the display panel shown in FIG. 3 is formed first, and then the display panel shown in FIG. 3 is bent to obtain a final display panel. In this case, the via in the bending component passes through the bending component in the thickness direction of the bending component.

In another optional embodiment of the present disclosure, after the bending component is bent, a via can be formed in the bending component to obtain a display panel. In this case, the via in the bending component passes through the bending component in a direction perpendicular to the display surface of the first component. For example, reference can be made to FIGS. 1 and 2.

Figure 5:
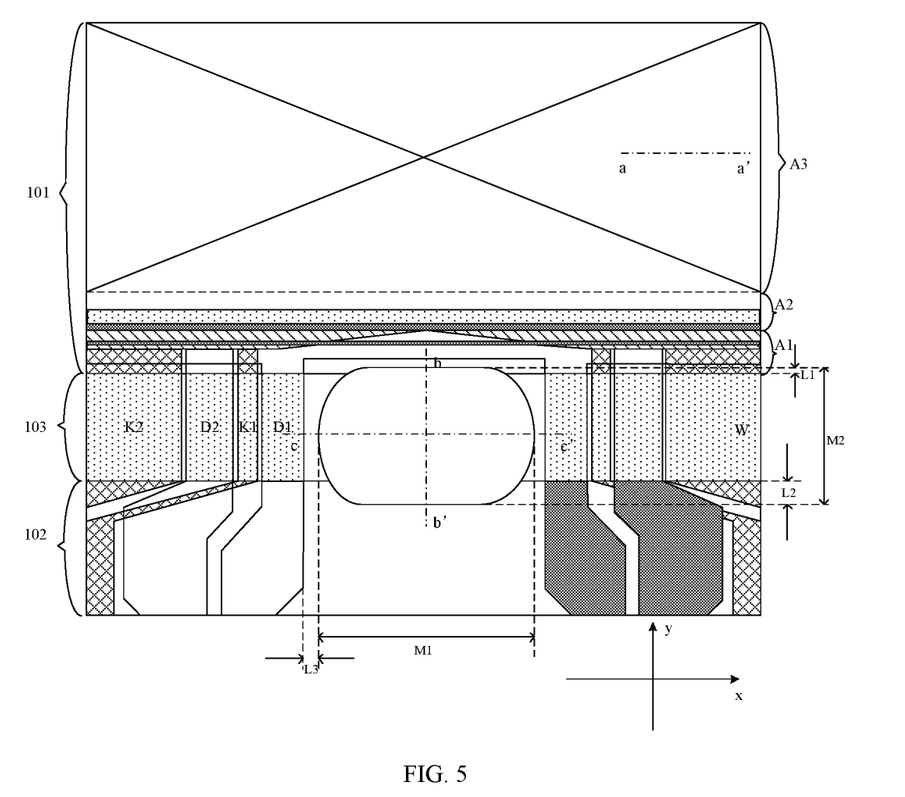
FIG. 5 is a schematic diagram of yet another deployed display panel provided by some embodiments of the present disclosure.

In some embodiments, the via in the bending component extends into the first component and the second component. Exemplarily, FIG. 5 is a schematic structural diagram of yet another display panel provided by some embodiments of the present disclosure, and FIG. 5 is a schematic structural diagram of the display panel in which the bending structure is in a flatly deployed state. As shown in FIG. 5, the first component 101 has a fan-out area A1, an edge area A2 and a display area A3 sequentially arranged in a direction away from the bending component 103, and the via H extends to the fan-out area A1. As the via extends to the fan-out area, when forming the signal leads in the fan-out area, it is necessary to circumvent the position of the via to prevent the open fault of the signal leads in the fan-out area when forming the hole.

Referring to FIG. 5, the bending component 103 has opposing first and second sides, the first side joins the first component 101, and the second side joins the second component 102. The maximum distance L1 from the edge of the via H in the first component 101 to the first side ranges from 145 to 155 microns; the maximum distance L2 from the edge of the via H in the second component 102 to the second side ranges from 1.2 to 1.6 mm.

In some embodiments, referring to FIG. 5 again, when the bending component 103 is in a flatly deployed state, the size M1 of the via H in the first direction x ranges from 7 to 9 mm, the size M2 of the via H in the second direction y ranges from 3 to 4 mm, and the second direction y is perpendicular to the first direction x.

Further referring to FIG. 5, the bending component 103 has a bending portion W located symmetrically on both sides of the via H in the first direction x. In the bending portion W, signal lines extending to the second component 102 are provided. The signal lines are connected to the signal leads in the fan-out area A1 of the first component 101. Here, the signal lines in the bending portion W include a first power signal line D1, a first data signal line K1, a second power signal line D2, and a second data signal line K2 that are arranged insulatedly and sequentially in a direction away from the via H. In some embodiments, the first power signal line is a VSS signal line, and the second power signal line is a VDD signal line.

In some embodiments, the minimum distance L3 between the via H and the first power signal line D1 ranges from 0.8 to 1.2 mm.

In some embodiments, the display panel further includes a control chip (not shown in the figure), and the signal lines in the second component 102 are connected to the control chip through a chip-on-film film (not shown in the figure). A driving chip is integrated in the control chip, and the first data signal line and the second data signal line in the bending portion are used to connect the data line in the first component and the driving chip in the second component.

The fan-out area A1 of the first component 101 is used to lead out various signal lines in the display area A3 and collect them to the bending portion W of the bending component 103; the signal lines in the bending portion W have a strong bending ability, and are used to connect the various signal lines in the display area A3 to the second component 102.

Figure 6:
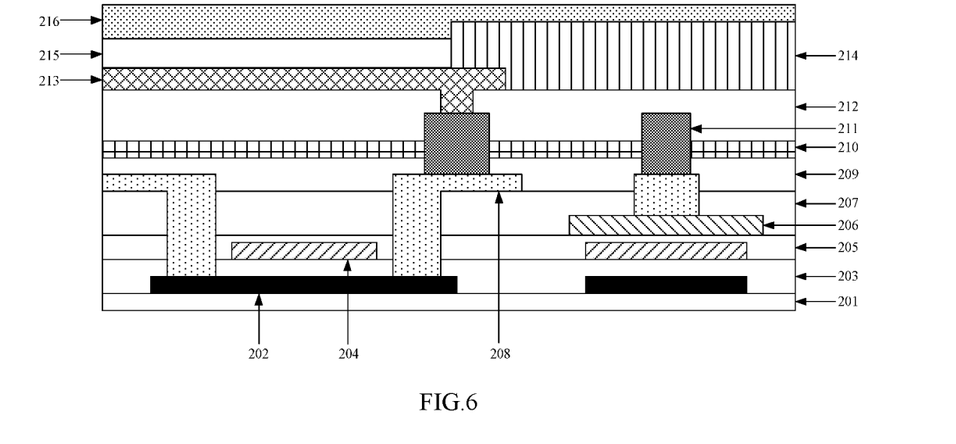
FIG. 6 is a schematic cross-sectional diagram of the display panel shown in FIG. 5 at the aa' position.

In some embodiments, FIG. 6 is a schematic cross-sectional diagram of the display panel shown in FIG. 5 at the aa' position. As shown in FIG. 6, the display area of the first component includes a flexible base substrate 201, and an active layer 202, a first insulation layer 203, a first gate layer 204, a second insulation layer 205, a second gate layer 206, an interlayer dielectric layer 207, a first source-drain layer 208, a passivation layer 209, a first planarizing layer 210, a second source-drain layer 211, a second planarizing layer 212, a metal conductive layer 213, a pixel-defining layer 214, a light-emitting device 215 and a packaging layer 216 sequentially arranged in a direction away from the flexible base substrate 201. In some embodiments, the metal conductive layer 213 is an anode layer, and the light-emitting device includes a hole injection layer, a hole transport layer, a light-emitting material layer, an electron transport layer, an electron injection layer, and a cathode layer sequentially disposed in a direction away from the flexible base substrate. In some embodiments, the light-emitting device is an organic light-emitting diode (OLED) device.

Figure 7:
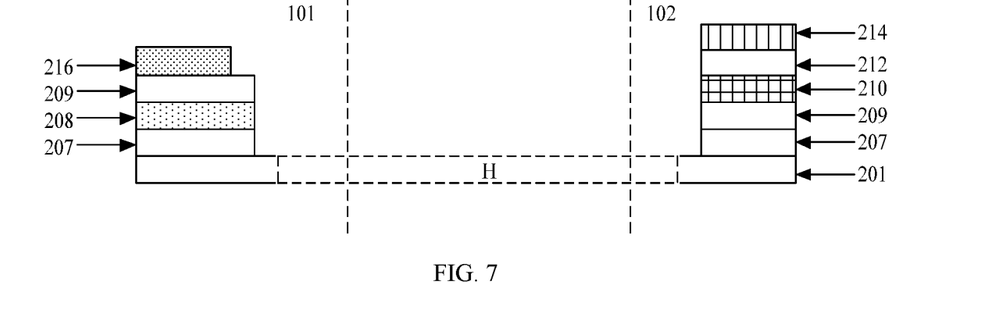
FIG. 7 is a schematic cross-sectional diagram of the display panel shown in FIG. 5 at the bb' position.

In some embodiments, FIG. 7 is a schematic cross-sectional diagram of the display panel shown in FIG. 5 at the bb' position. As shown in FIG. 7, the region of the first component 101 on the side of the via H distal from the second component 102 includes the flexible base substrate 201, and the interlayer dielectric layer 207, the first source-drain layer 208, the passivation layer 209 and the packaging layer 216 sequentially disposed in a direction away from the flexible base substrate 201. The region of the second component 102 on the side of the via H distal from the first component 101 includes the flexible base substrate 201, and the interlayer dielectric layer 207, the passivation layer 209, the first planarizing layer 210, the second planarizing layer 212, and the pixel-defining layer 214 sequentially disposed in a direction away from the flexible base substrate 201.

According to FIG. 7, it can be seen that the film layers in the region adjacent to the via in the second component are all non-conductive film layers, that is, the signal lines in the second component are arranged to circumvent the via.

Figure 8:
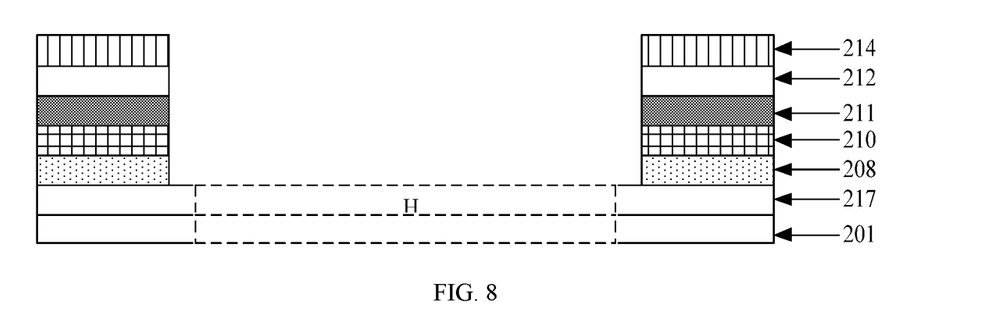
FIG. 8 is a schematic cross-sectional diagram of the display panel shown in FIG. 5 at the cc' position.

In some embodiments, FIG. 8 is a schematic cross-sectional diagram of the display panel shown in FIG. 5 at the cc' position. As shown in FIG. 8, the region, where the first power signal line is located, in the bending portion of the bending component includes the flexible base substrate 201, and a flexible material layer 217, the first source-drain layer 208, the first planarizing layer 210, the second source-drain layer 211, the second planarizing layer 212, and the pixel-defining layer 214 sequentially arranged in a direction away from the flexible base substrate 201. In the embodiment of the present disclosure, the first power signal line, the first data signal line, the second power signal line, and the second data signal line in the bending portion are all in a two-layer structure including the first source-drain layer and the second source-drain layer; signal lines in the fan-out area connected to the first power signal line and the second power signal line are formed by stacking the first source-drain layer and the second source-drain layer. The signal lines in the fan-out area connected to the first data signal line and the second data signal line are formed by stacking the first gate layer and the second gate layer.

In some embodiments, a flexible material layer is provided as an entire layer in the bending portion of the bending component to enhance the toughness of the bending component. In some embodiments, the flexible material layer is formed of polyimide (PI) or polyethylene terephthalate (PET) material.

In summary, in the display panel provided by the embodiment of the present disclosure, by disposing the via(s) passing through the bending component, when the bending component is in a bent state, the via(s) is/are beneficial for releasing the internal stress of the bending component, so as to achieve a balance in stress of the respective areas of the bending component, thereby ensuring the structural stability and reliability of the display panel. In addition, as the via in the bending component passes through the bending component in a direction substantially perpendicular to the display surface, by accommodating the support structure in the via, one end of the support structure accommodated in the via may be connected with the flexible cover plate when the display panel is encapsulated with the flexible cover plate. As such, when the flexible cover plate is subjected to external forces such as a press, the support structure can provide a great supporting effect to avoid the breakage of the signal lines in the bending component due to the external force thereon, thereby ensuring the mechanical performance of the display panel.

Some embodiments of the present disclosure provide a display device including the display panel as shown in any one of FIGS. 1 to 8.

Figure 9:
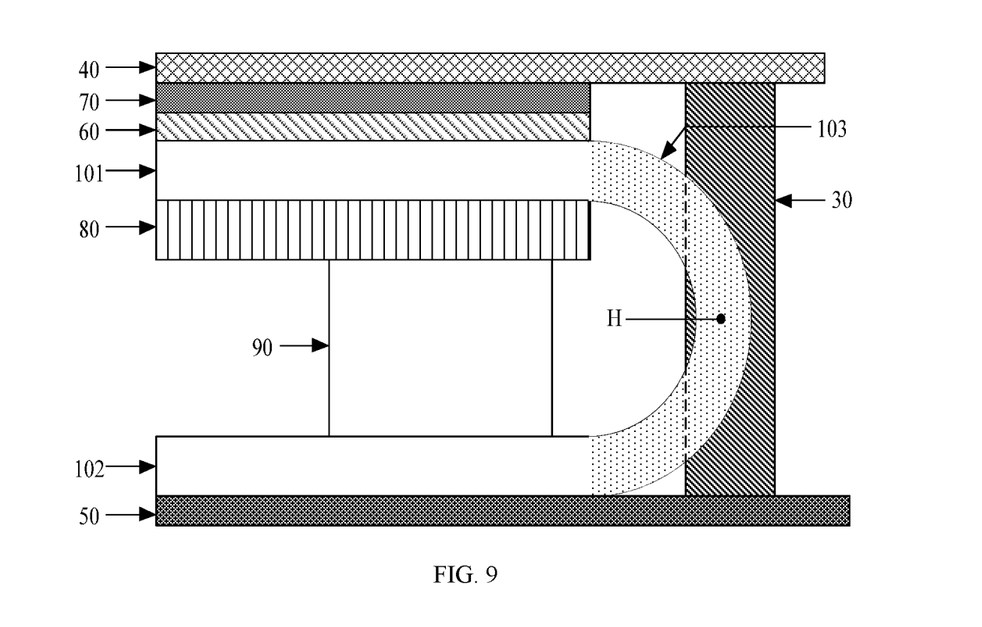
FIG. 9 is a schematic structural diagram of a display device provided by some embodiments of the present disclosure.

In some embodiments, FIG. 9 is a schematic structural diagram of a display device provided by some embodiments of the present disclosure. As shown in FIG. 9, the display device includes a display panel as shown in FIG. 2, a support structure 30, a cover plate 40 on the side of the first component 101 distal from the second component 102, and a bottom plate 50 on the side of the second component 102 distal from the first component 101. In some embodiments, the bottom plate is also referred to as a back plate, and is a casing of the display device.

Referring to FIG. 9, the first end of the support structure 30 is connected to the cover plate 40, and the second end of the support structure 30 is connected to the bottom plate 50. The orthographic projection of the support structure 30 onto the cover plate 40 and the orthographic projection of the via H onto the cover plate 40 have overlapping areas. That is, at least partial structure of the support structure is within the via of the bending component.

Figure 10:
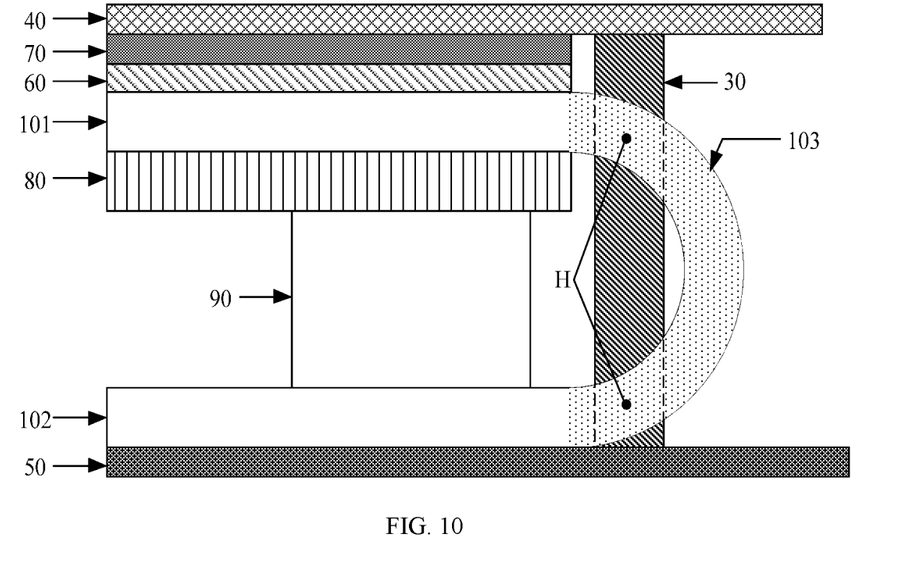
FIG. 10 is a schematic structural diagram of another display device provided by some embodiments of the present disclosure.

In some embodiments, the orthographic projection of the support structure onto the cover plate is within the orthographic projection of the via onto the cover plate. That is, the support structure is completely located within the via of the bending component. Exemplarily, FIG. 10 is a schematic structural diagram of another display device provided by some embodiments of the present disclosure. As shown in FIG. 10, the display device includes the display panel shown in FIG. 1, the orthographic projection of the support structure 30 onto the cover plate 40 is within the orthographic projection of the via H onto the cover plate 40.

Here, the first component is a display component, and the second component is a bonding component. The display device further includes a control chip (not shown in the figure) connected to the second component.

In some embodiments, the support structure is made of a rigid material. For example, the preparation material of the support structure includes one of plastic and metal materials.

In some embodiments, the cover plate is made of a flexible material, that is, the cover plate is a flexible cover plate, so as to realize the bendable and/or foldable function of the display device. For example, the preparation material of the cover plate includes one of an organic resin material and an inorganic flexible material. In some embodiments, the organic resin material is a PI material or PET material, and the inorganic flexible material is an ultra-thin glass.

In some embodiments, referring to FIG. 9 and FIG. 10, the display device further includes a touch layer 60 and a polarizer 70 which are located on the side of the first component 101 distal from the second component 102 and are stacked in a direction away from the first component 101.

In some embodiments, referring to FIG. 9 and FIG. 10 again, the display device further includes a heat dissipation film 80 on the side of the first component 101 proximal to the second component 102. The heat dissipation film is used for heat dissipation, to avoid the overheat temperature of the display component that may influence the normal operation of internal devices.

In some embodiments, further referring to FIG. 9 and FIG. 10, the display device further includes a support assembly 90 between the heat dissipation film 80 and the second component 102, the first end of the support assembly 90 is connected to the heat dissipation film 80, and the second end of the support assembly 90 is connected to the second component 102. The support assembly is used for supporting and limiting position. As the second component is connected to the first component through the bending component, there is a gap between the second component and the first component. By providing a support assembly between the heat dissipation film and the second component, on the one hand, a supporting effect can be provided to the first component and the heat dissipation film, the touch layer and the polarizer on the both sides of the first component, on the other hand, the relative position of the first component and the second component can be defined, so as to ensure the structural stability of the display device.

In summary, in the display device provided by the embodiment of the present disclosure, as the via passing through the bending component in a direction perpendicular to the display surface is provided in the bending component of the display panel, by providing a support structure in the via, the first end of the support structure is connected to the cover plate and the second end of the support structure is connected to the bottom plate. As such, when the cover plate is subjected to external forces such as a press, the support structure can provide a great supporting effect to avoid the breakage of the signal lines in the bending component due to the external force thereon, thereby ensuring the mechanical performance of the display device. In addition, as the support structure is within the via in the bending component, there is no need to increase the width of the edge of the display device, which facilitates the realization of the narrow bezel design of the display device.

Figure 11:
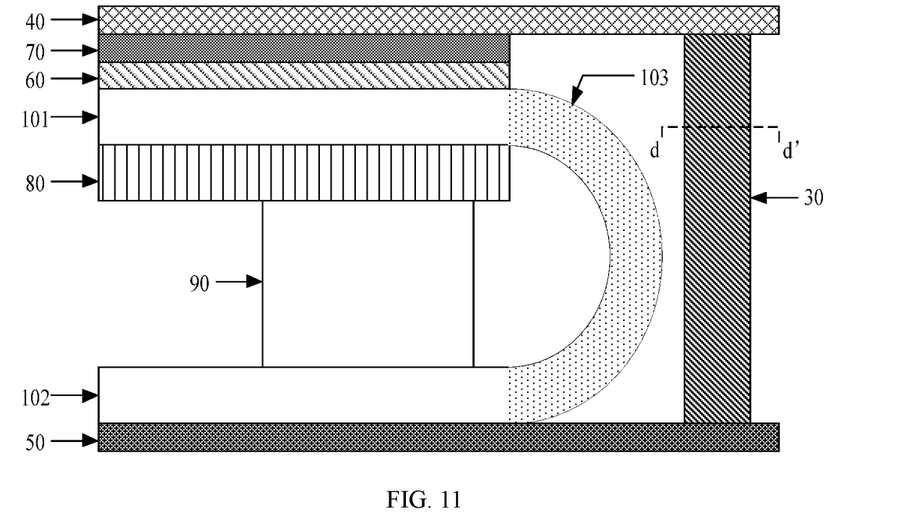
FIG. 11 is a schematic structural diagram of a display device provided by another embodiment of the present disclosure.

FIG. 11 is a schematic structural diagram of a display device provided by another embodiment of the present disclosure. As shown in FIG. 11, the display device includes: a display panel, a support structure 30, a cover plate 40 and a bottom plate 50.

Referring to FIG. 11, the display panel includes a first component 101, a second component 102, and a bending component 103 connecting the first component 101 and the second component. The cover plate 40 is located on the side of the first component 101 distal from the second component 102. The bottom plate 50 is located on the side of the second component 102 distal from the first component 101. The support structure 30 is located on the side of the bending component 103 distal from the first component 101 and the second component 102. The first end of the support structure 30 is connected to the cover plate 40, and the second end of the support structure 30 is connected to the bottom plate 50.

In some embodiments, the first component is a display component, and the second component is a bonding component. The display device further includes a control chip (not shown in the figure) connected to the second component. In some embodiments, the display panel is also a display panel as shown in any one of FIGS. 1 to 8.

In summary, in the display device provided by the embodiment of the present disclosure, by providing a support structure on the side of the bending component distal from the first component and the second component, the first end of the support structure is connected to the cover plate and the second end of the support structure is connected to the bottom plate. As such, when the cover plate is subjected to external forces such as a press, the support structure can provide a great supporting effect to avoid the breakage of the signal lines in the bending component due to the external force thereon, thereby ensuring the mechanical performance of the display device.

Figure 12:
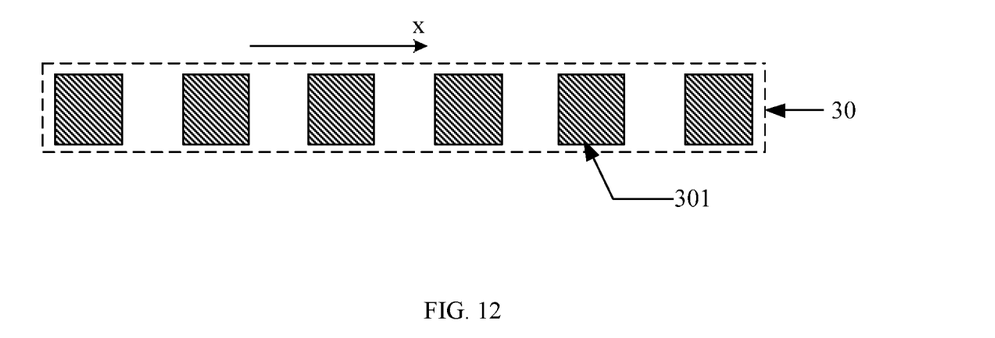
FIG. 12 is a schematic diagram showing a cross-section of the support structure in the display device shown in FIG. 11 at the dd' position.

In some embodiments, FIG. 12 is a schematic diagram showing a cross-section of the support structure in the display device shown in FIG. 11 at the dd' position. As shown in FIG. 12, the support structure 30 includes a plurality of columnar structures 301 arranged in an array along a first direction x which is parallel to the bending axis of the bending component. In FIG. 11, the first direction is the direction perpendicular to the paper plane.

Figure 13:
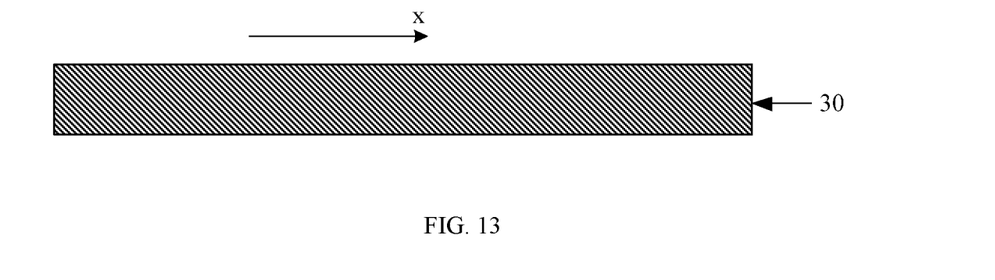
FIG. 13 is a schematic diagram showing another cross-section of the support structure in the display device shown in FIG. 11 at the dd' position.

In some embodiments, FIG. 13 is schematic diagram showing another cross-section of the support structure in the display device shown in FIG. 11 at the dd' position. As shown in FIG. 13, the support structure 30 is a row structure extending in the first direction x which is parallel to the bending axis of the bending component.

In some embodiments, the length of the support structure 30 in the first direction x in FIGS. 12 and 13 is equal to the length of the bending component in the first direction.

It should be noted that by providing a support structure on the side of the bending component distal from the first and second components, and making the length of the support structure in the first direction be equal to the length of the bending component in the first direction, when the cover plate is subjected to an external force such as a press, the support structure can provide a supporting effect and protect the bending component from external forces, thereby preventing the signal lines in the bending component from breaking.

In some embodiments, the cover plate is made of a flexible material, that is, the cover plate is a flexible cover plate, so as to achieve the bendable and/or foldable function for the display device. For example, the preparation material of the cover plate includes one of an organic resin material and an inorganic flexible material. In some embodiments, the organic resin material is a PI material or PET material, and the inorganic flexible material is ultra-thin glass.

In some embodiments, referring to FIG. 11, the display device further includes a touch layer 60 and a polarizer 70 that are located on a side of the first component 101 distal from the second component 102 and are stacked in a direction away from the first component 101.

In some embodiments, referring to FIG. 11 again, the display device further includes a heat dissipation film 80 on the side of the first component 101 proximal to the second component 102. The heat dissipation film is used for heat dissipation, so as to avoid the overheat temperature of the display component that may influence the normal operation of internal devices.

In some embodiments, further referring to FIG. 11, the display device further includes a support assembly 90 between the heat dissipation film 80 and the second component 102. The first end of the support assembly 90 is connected to the heat dissipation film 80, and the second end of the support assembly 90 is connected to the second component 102. The support assembly is used for supporting and limiting position. As the second component is connected to the first component through the bending component, there is a gap between the second component and the first component. By providing a support assembly between the heat dissipation film and the second component, on the one hand, a supporting effect can be provided to the first component and the heat dissipation film, the touch layer and the polarizer on the both sides of the first component, on the other hand, the relative position of the first component and the second component can be defined, so as to ensure the structural stability of the display device.

In summary, in the display device provided by the embodiment of the present disclosure, by providing a support structure on the side of the bending component distal from the first component and the second component, the first end of the support structure is connected to the cover plate and the second end of the support structure is connected to the bottom plate. As such, when the cover plate is subjected to external forces such as a press, the support structure can provide a great supporting effect to avoid the breakage of the signal lines in the bending component due to the external force thereon, thereby ensuring the mechanical performance of the display device.

It should be noted that in the accompanying drawings, for clarity of the illustration, the dimension of the layers and regions may be scaled up. It may be understood that when an element or layer is described as being "on" another element or layer, the described element or layer may be directly located on the other element or layer, or at least one intermediate layer may exist. In addition, It may be understood that when an element or layer is described as being "under" another element or layer, the described element or layer may be directly located under the other element or layer, or at least one intermediate layer may exist. In addition, it may be further understood that when a layer or element is described as being arranged "between" two layers or elements, the described layer or element may be the only layer between the two layers or elements, or at least one additional intermediate layer or element may exist. In the whole specification, like reference numerals denote like elements.

In the present disclosure, the terms "first" and "second" are only used for descriptive purposes and should not be construed as indicating or implying relative importance. The term "a plurality of" refers to two or more, unless explicitly defined otherwise.

The term "and/or" in the embodiments of the present disclosure merely describes the corresponding relationship of the associated objects, indicating three kinds of relationship. For example, A and/or B can indicate that: A exists alone, A and B exist concurrently, and B exists alone. In addition, the character "/" in the present disclosure generally indicates that the associated objects in the context is in an "OR" relationship.

The foregoing descriptions are merely optional embodiments of the present disclosure, and are not intended to limit the present disclosure. Within the concept and principles of the present disclosure, any modifications, equivalent substitutions, improvements, etc., are within the protection scope of the present disclosure.

The invention claimed is:

1. A display device, comprising:
   a first component, a second component, and a bending component connecting the first component and the second component;
   wherein the first component has a display surface, and the bending component has a via passing through the bending component in a direction substantially perpendicular to the display surface,
   the display device further comprising a support structure located on a side of the bending component distal from the first component and the second component, a cover plate located on a side of the first component distal from the second component, and a bottom plate located on a side of the second component distal from the first component, wherein at least a partial structure of the support structure passes through the via, a first end of the support structure is connected with the cover plate, a second end of the support structure is connected to the bottom plate, and the support structure is configured to support the cover plate.

2. The display device of claim 1, wherein the bending component comprises a first bending subcomponent connected to the first component and a second bending subcomponent connected to the second component; and the via comprises a first hole in the first bending subcomponent and a second hole in the second bending subcomponent, and an orthographic projection of the first hole onto a plane of the display surface and an orthographic projection of the second hole onto the plane of the display surface at least partially coincide or completely coincide.

3. The display device of claim 2, wherein the first hole communicates with the second hole.

4. The display device of claim 2, wherein the support structure passes through the first hole and the second hole, an aperture size of the support structure matches an aperture size of the first hole and an aperture size of the second hole, and a position of the support structure in a direction parallel to the display surface is limited by the via; and/or in a direction parallel to the display surface, a gap is formed between the support structure and the first component and between the support structure and the second component.

5. The display device of claim 1, wherein a number of the via is at least 1, and each via passes through the bending component in a thickness direction of the bending component.

6. The display device of claim 1, wherein the via extends into the first component and the second component.

7. The display device of claim 6, wherein the first component has a fan-out area, an edge area, and a display area sequentially arranged in a direction away from the bending component, and the via extends to the fan-out area.

8. The display device of claim 1, wherein the via is located at a center of the bending component in a first direction, wherein the first direction is parallel to a bending axis of the bending component.

9. The display device of claim 8, wherein the bending component has a bending portion symmetrically arranged on both sides of the via in the first direction, and the bending portion is provided with signal lines extending to the second component and connected to signal leads in a fan-out area of the first component.

10. The display device of claim 9, wherein the signal lines in the bending portion comprises a first power signal line, a first data signal line, a second power signal line and a second data signal line that are arranged insulatedly and sequentially in a direction away from the via.

11. The display device of claim 9, further comprising a control chip, wherein the signal lines in the second component are connected to the control chip through a chip-on-film film.

12. The display device of claim 1, wherein the display area of the first component comprises a flexible base substrate, and an active layer, a first insulation layer, a first gate layer, a second insulation layer, a second gate layer, an interlayer dielectric layer, a first source-drain layer, a passivation layer, a first planarizing layer, a second source-drain layer, a second planarizing layer, a metal conductive layer, a pixel-defining layer, a light-emitting device and a packaging layer sequentially arranged in a direction away from the flexible base substrate.

13. The display device of claim 12, wherein a region of the first component on a side of the via distal from the second component comprises the flexible base substrate, and the interlayer dielectric layer, the first source-drain layer, the passivation layer, and the packaging layer sequentially arranged in a direction away from the flexible base substrate;

a region, where the first power signal line is located, in the bending portion of the bending component comprises the flexible base substrate, and a flexible material layer, the first source-drain layer, the first planarizing layer, the second source-drain layer, the second planarizing layer, and the pixel-defining layer sequentially arranged in a direction away from the flexible base substrate;

a region of the second component on a side of the via distal from the first component comprises the flexible base substrate, and the interlayer dielectric layer, the passivation layer, the first planarizing layer, the second planarizing layer, and the pixel-defining layer sequentially arranged in a direction away from the flexible base substrate.

14. The display device of claim 13, wherein a number of the via is 1, and the via passes through the bending component in a thickness direction of the bending component; the via extends into the first component, and the via extends into the second component.

15. The display device of claim 1, wherein, an orthographic projection of the support structure onto the cover plate and an orthographic projection of the via onto the cover plate has an overlapping area; or the orthographic projection of the support structure onto the cover plate is within the orthographic projection of the via onto the cover plate; or the support structure is located on a side of the bending component distal from the first component and the second component.

16. The display device of claim 15, wherein a preparation material of the support structure comprises one of plastic and metal materials, and/or, the preparation material of the cover plate comprises one of an organic resin material and an inorganic flexible material.

17. The display device of claim 1, further comprising at least one selected from the group consisting of:

a touch layer and a polarizer located on a side of the first component distal from the second component and stacked in a direction away from the first component;

a heat dissipation film on a side of the first component proximal to the second component; or a support assembly between the heat dissipation film and the second component, a first end of the support assembly is connected to the heat dissipation film, and a second end of the support assembly is connected to the second component.

18. The display device of claim 1, wherein a surface of the first component distal from the second component is a display surface, the support structure comprises a plurality of columnar structures arranged in an array in a first direction, and a gap exists between two adjacent columnar structures, wherein the first direction is parallel to a bending axis of the bending component.

19. A display device, comprising:
- a display panel including a first component, a second component, and a bending component connecting the first component and the second component;
- a cover plate located on a side of the first component distal from the second component;
- a bottom plate located on a side of the second component distal from the first component; and
- a support structure located on a side of the bending component distal from the first component and the second component, wherein a first end of the support structure is connected to the cover plate, and a second end of the support structure is connected to the bottom plate.

20. The display device of claim 19, wherein a surface of the first component distal from the second component is a display surface, the support structure comprises a plurality of columnar structures arranged in an array in a first direction, and a gap exists between two adjacent columnar structures, wherein the first direction is parallel to a bending axis of the bending component.

* * * * *